United States Patent
Yonezawa et al.

(10) Patent No.: US 7,821,014 B2
(45) Date of Patent: Oct. 26, 2010

(54) SEMICONDUCTOR DEVICE AND MANUFACTURING METHOD THEREOF WITH A RECESSED BACKSIDE SUBSTRATE FOR BREAKDOWN VOLTAGE BLOCKING

(75) Inventors: Yoshiyuki Yonezawa, Nagano (JP); Daisuke Kishimoto, Fukushima (JP)

(73) Assignee: Fuji Electric Systems Co., Ltd. (JP)

( * ) Notice: Subject to any disclaimer, the term of this patent is extended or adjusted under 35 U.S.C. 154(b) by 49 days.

(21) Appl. No.: 11/683,993

(22) Filed: Mar. 8, 2007

(65) Prior Publication Data

US 2007/0210316 A1 Sep. 13, 2007

(30) Foreign Application Priority Data

Mar. 13, 2006 (JP) .............................. 2006-066876

(51) Int. Cl.
*H01L 31/0312* (2006.01)
*H01L 29/06* (2006.01)
*H01L 21/332* (2006.01)
*H01L 21/8222* (2006.01)

(52) U.S. Cl. .................. 257/77; 257/619; 257/622; 257/623; 257/E21.054; 257/E29.023; 438/140; 438/319

(58) Field of Classification Search .............. 257/77, 257/619, 622, 623, E21.054, E29.023; 438/140, 438/319
See application file for complete search history.

(56) References Cited

U.S. PATENT DOCUMENTS

| | | | |
|---|---|---|---|
| 2003/0092211 A1* | 5/2003 | Hosoda | 438/46 |
| 2004/0130002 A1* | 7/2004 | Weeks et al. | 257/622 |
| 2004/0180470 A1* | 9/2004 | Romano et al. | 438/106 |
| 2005/0067716 A1* | 3/2005 | Mishra et al. | 257/778 |
| 2005/0242369 A1* | 11/2005 | Udrea et al. | 257/107 |
| 2006/0097268 A1* | 5/2006 | Kumar et al. | 257/77 |
| 2008/0169475 A1* | 7/2008 | Nishio et al. | 257/77 |

FOREIGN PATENT DOCUMENTS

| | | | |
|---|---|---|---|
| DE | 10038190 A1 * | 2/2002 | |
| JP | 2004-022878 A | 1/2004 | |
| JP | 2005-005428 A | 1/2005 | |
| JP | 2005-260267 A | 9/2005 | |

OTHER PUBLICATIONS

A Partial English Translation of T. Ishida et al., "Application of High Temperature Metal Superconducting Material MgB2 to Electronics", Kotai Butsuri (Solid State Physics), 2005, pp. 51-67, vol. 40, No. 1.

* cited by examiner

*Primary Examiner*—Hsien-ming Lee
*Assistant Examiner*—Kevin Parendo
(74) *Attorney, Agent, or Firm*—Rossi, Kimms & McDowell LLP

(57) ABSTRACT

A semiconductor device and a manufacturing method thereof uses a semiconductor substrate of silicon carbide. On one principal surface side of the substrate, at its central section, a layer of silicon carbide or gallium nitride as a semiconductor layer having the thickness at least necessary for breakdown voltage blocking is epitaxially grown or formed from part of the substrate. A recess is formed in the other principal surface side of substrate at a position facing the central section. A supporting section surrounds the bottom of the recess and provides the side face of the recess. The recess is formed by processing such as dry etching. The semiconductor device, even though the semiconductor substrate is made thinner for the realization of small on-resistance, can maintain the strength of the semiconductor substrate capable of reducing occurrence of a wafer cracking during the manufacturing process.

18 Claims, 7 Drawing Sheets

SEMICONDUCTOR DEVICE AND MANUFACTURING METHOD THEREOF WITH A RECESSED BACKSIDE SUBSTRATE FOR BREAKDOWN VOLTAGE BLOCKING

BACKGROUND

Presently, for a power semiconductor device carrying out control of high frequency and high power, a silicon (hereinafter sometimes referred to as "Si") semiconductor is mainly used. As the band gap (forbidden band width) of the Si semiconductor, however, is merely on the order of 1.1 eV, it is not possible sometimes to use an Si semiconductor device in a high temperature environment or when exposing to radiation. As a measure against this problem, attempts have been made to use silicon carbide (hereinafter sometimes referred to as "SiC") semiconductor having a band gap that is much wider than that of Si.

Silicon carbide is a crystalline material that is physically, chemically, and thermally stable, with a higher thermal conductivity than that of silicon. In addition, for example, the band gap of 4H—SiC as one of various polytypes is 3.25 eV, which is on the order of three times larger in comparison with 1.12 eV of Si. This makes the electric field strength causing insulation breakdown of silicon carbide (2 to 4 MV/cm) approximately one order of magnitude larger than that of silicon (0.3 MV/cm). Therefore, silicon carbide is particularly excellent as a material for a power semiconductor device that requires stability when operated at a high voltage or in a high temperature environment.

In a power semiconductor device, its on-resistance is inversely proportional to the third power of the insulation breakdown electric field strength of the material and reduces in proportion to the reciprocal of carrier mobility. Therefore, even though the carrier mobility in a silicon carbide semiconductor being lower than that of silicon semiconductor is taken into consideration, in a semiconductor substrate of silicon carbide, for example, the on-resistance thereof can be reduced to hundredths in comparison with the on-resistance of a silicon semiconductor substrate. Up to the present time, power semiconductor devices with various structures of power semiconductor devices such as diodes, transistors, and thyristors have been experimentally manufactured using silicon carbide, part of which has been already in actual use. See JP-A-2005-5428.

Meanwhile, in a power semiconductor device such as a vertical MOSFET or an IGBT using silicon as the chief material thereof, an FZ-Si wafer, for example, is used for the semiconductor substrate thereof. In this case, for reducing the contribution of a drift layer to on-resistance, the wafer is ground thinner to make the thickness of the drift layer to the minimum necessary for breakdown voltage blocking. Such a wafer thinning process technology of grinding a wafer has been developed. The thickness of the drift layer determining the breakdown voltage is determined depending on the physical property values of a semiconductor material. For example, in silicon, the thickness is approximately 70 µm for a breakdown voltage of 600V and approximately 100 µm for a breakdown voltage of 1200V.

In the development of the manufacturing process of a semiconductor device using silicon carbide, one of the goals of the development is to establish the technology of processing a thin wafer ground to the minimum necessary thickness for breakdown voltage blocking, such as a wafer with a thickness of the order of 70 µm. Thus, the establishment of the technology is progressing to a considerable extent in aspects such as an improvement in a wafer handling method for handling thin wafers. See JP-A-2005-260267.

For reducing the on-resistance of an SiC semiconductor device, JP-A-2004-22878 discloses depositing a semiconductor layer on a silicon carbide substrate before the substrate is ground to a thickness of 200 µm or less. That publication, however, discloses reducing the thickness of a semiconductor device from 400 µm to approximately 200 µm, without regards to the lower limit of the thickness of the substrate. In the first embodiment described in that publication, for manufacturing a Schottky diode, a 10 µm thick epitaxially grown layer is deposited on a silicon carbide substrate before boron ions are implanted to form a doped layer, on which an electrode is formed. When using the such manufacturing method to reduce the thickness of the substrate beyond 200 µm, such as a thickness of 100 µm or 50 µm, for example, occurrence of cracking of the substrate is predicted like in the manufacturing process of silicon. Therefore, although a semiconductor device with the thickness of the substrate being 200 µm or less is disclosed in that publication, only the manufacturing method specifically disclosed that makes the thickness of a substrate approximately 200 µm is grinding.

In a semiconductor device with silicon carbide or gallium nitride used as the chief material thereof, the margin of avalanche breakdown voltage is higher than that of a semiconductor device using silicon. Therefore, the thickness of a breakdown voltage blocking region in a MOSFET or an IGBT with the design breakdown voltage thereof being 600V to 1200V can be around 10 µm or less.

The volume resistivity of a currently available low resistance substrate of silicon carbide is higher in comparison with that of a silicon substrate. For example, in the case of silicon, a wafer having a volume resistivity less than 0.001 Ωcm is available. In contrast, in the case of silicon carbide, only a wafer having a resistivity in the range from 0.02 to 0.01 Ωcm, which is ten times or larger than the resistivity of a silicon wafer, is usable.

Moreover, when manufacturing a semiconductor device with gallium nitride used as the chief material thereof, there is difficulty in obtaining a single crystal substrate of gallium nitride. Therefore, a method is employed in which a semiconductor layer of gallium nitride is formed by hetero-epitaxial growth on a substrate of silicon carbide or sapphire.

Here, the proportion of the resistance of a silicon carbide substrate in the on-resistance of a semiconductor device will be simply obtained. The proportion will be calculated about a MOSFET manufactured by growing an epitaxial layer of silicon carbide or gallium nitride on a silicon carbide substrate with its volume resistivity being low to the currently available extent. A semiconductor layer, which becomes a MOS gate region, is epitaxially grown on the top surface of the substrate. If the silicon carbide substrate, which becomes a drain region, has a thickness approximately equal to the original thickness of 500 µm and the volume resistivity of the substrate is 0.01 Ωcm, the resistance of the substrate is calculated out as approximately 0.5 mΩcm². Since the typical on-resistance of a MOSFET with silicon carbide used as the chief material thereof is 10 mΩcm² at present, the proportion of the resistance of the silicon carbide substrate (drain region) in the on-resistance becomes approximately 5%. When the substrate forms the drain region or the collector region of a vertical power semiconductor device, the resistance of the substrate is to be 5% of the on-resistance in the region.

At present, most of the on-resistance of the MOSFET is channel resistance. Improvement in channel mobility makes the figure of 10 mΩcm² expected to be a half or less. If the channel mobility is doubled, then the proportion of the resistance of a substrate in on-resistance becomes approximately 10%. Further improvement in the channel mobility will further increase the proportion of the resistance of the substrate. Thus, the reduction of the resistance of the substrate is considered to be an important issue. The volume resistivity of a currently available silicon carbide substrate, however, is on the order of 0.01 Ωcm. Reducing the volume resistivity necessitates further technological development with anticipated difficulties.

With the foregoing situation taken into consideration, also in manufacturing a vertical power semiconductor device with silicon carbide or gallium nitride used as the chief material thereof, it is considered that the establishment of the process for thinning a substrate or a wafer would become sometime indispensable for reducing the on-resistance like in the case of using silicon.

In a semiconductor device with silicon carbide or gallium nitride used as the chief material thereof, as described in the foregoing, the breakdown voltage of around 1000V can be obtained with the breakdown voltage blocking region provided as thin as approximately 10 μcm. Therefore, for the purpose of reducing on-resistance, a manufacturing method can be thought of in which a substrate of silicon carbide is made thinner like in a silicon process so as to be on the order of 10 μm thick, for example, necessary for breakdown voltage blocking. However, in an attempt to grind a semiconductor substrate or a wafer for thinning it down to on the order of 10 μcm, occurrence of defects such as cracking and chipping and production of an enormous number of particles cannot be avoided. Thus, the establishment of an excellent manufacturing process is considered to be difficult. In a silicon semiconductor device, the thickness of a breakdown voltage blocking region is 70 μcm for 600V and 100 μm for 1200V. The relatively higher thickness enables the process of thinning the entire surface of a wafer.

The present invention was developed in view of the background art and problems associated therewith. There remains a need to reduce the on-resistance of a semiconductor device having a semiconductor layer of silicon carbide or gallium nitride on a semiconductor substrate, while providing a structure that is able to retain the strength of a semiconductor substrate without cracking the wafer. The present invention addresses this need.

SUMMARY OF THE INVENTION

The present invention relates to a semiconductor device such as a vertical MOSFET (metal-oxide-semiconductor field effect transistor), an IGBT (insulated gate bipolar transistor), a bipolar transistor or a diode, such as a Schottky diode, the chief material of which is silicon carbide or gallium nitride. In particular, the invention relates to a semiconductor device using a semiconductor substrate having a shape for reducing a proportion of the resistance of a semiconductor substrate in the on-resistance of the semiconductor device and a manufacturing method of the device.

One aspect of the invention is a semiconductor device. The semiconductor device can include a semiconductor substrate and a semiconductor layer composed of silicon carbide or gallium nitride. The substrate, which can be composed of silicon carbide, has a first principal surface side and a second principal surface side opposite the first principal surface side. The semiconductor layer, which can be an epitaxial layer or part of the substrate, has a thickness at least necessary for breakdown voltage blocking. The semiconductor layer is on the first principal surface side of the substrate, at a central section of the first principal surface side. The substrate has, in the second principal surface side of the substrate, a recess at a position facing the central section and a supporting section that surrounds the bottom of the recess and provides side faces of the recess.

The semiconductor substrate can have a thickness of 1 to 50 μm at the bottom of the recess. The supporting section of the semiconductor substrate has a thickness of 200 to 500 μm. The semiconductor layer is provided with a planar breakdown voltage blocking structure as the breakdown voltage blocking structure thereof. The semiconductor substrate and the semiconductor layer can be provided with a mesa groove structure as the breakdown voltage blocking structure thereof.

The semiconductor substrate and the semiconductor layer each can be of a first conductivity type. In the bottom of the recess, a region of the first or second conductivity type with an impurity concentration higher than that in the semiconductor layer is provided. If the region is of the first conductivity type, the semiconductor device can be a MOSFET or a Schottky diode. If the region is of the second conductivity type, the semiconductor device can be an IGBT.

Alternatively, the semiconductor substrate can be of a second conductivity type, the semiconductor layer can be of a first conductivity type. In the bottom of the recess, a region of the second conductivity type with an impurity concentration higher than that in the semiconductor layer is provided. Here, the semiconductor device can be another kind of IGBT.

In the bottom of the recess, between the semiconductor layer and the region of the second conductivity type, a region of the first conductivity type with an impurity concentration higher than that in the semiconductor layer is provided. Here, the semiconductor device can be another kind of IGBT.

Another aspect of the present invention is a method of manufacturing the above-described semiconductor device. The method includes providing the substrate, forming on the first principal surface side of the semiconductor substrate, at the central section of the first principal surface side, the semiconductor layer, and forming in the second principal surface side of the substrate the recess at the position facing the central section and the supporting section that surrounds the bottom of the recess and provides the side face of the recess.

The semiconductor substrate is of silicon carbide and the semiconductor layer can be part of the substrate or formed by an epitaxial lateral over growth using a mask or an epitaxial growth. The mask used in the epitaxial lateral over growth can be used as a marker for stopping the recess forming step. The recess can be formed by at least one of dry etching or particle blasting.

The method can further include implanting ion and activating annealing the implanted ions onto the second principal surface side of the semiconductor. The activation annealing can be carried out by laser annealing. Laser annealing can localize heating to activate the implanted impurity ions without heating the entire semiconductor device.

The recess is formed while optically measuring the thickness of the bottom by projecting light, having a wavelength range allowing the light to transmit the semiconductor substrate, from the first principal surface side of the semiconductor substrate.

The recess can be formed after or before forming the semiconductor layer. Moreover, before and after forming the recess or semiconductor layer, another processing can be carried out.

Here, the first conductivity type and the second conductivity type can be an n-type and a p-type, respectively, and conversely, can be the p-type and the n-type, respectively.

DETAILED DESCRIPTION

Figure 1:
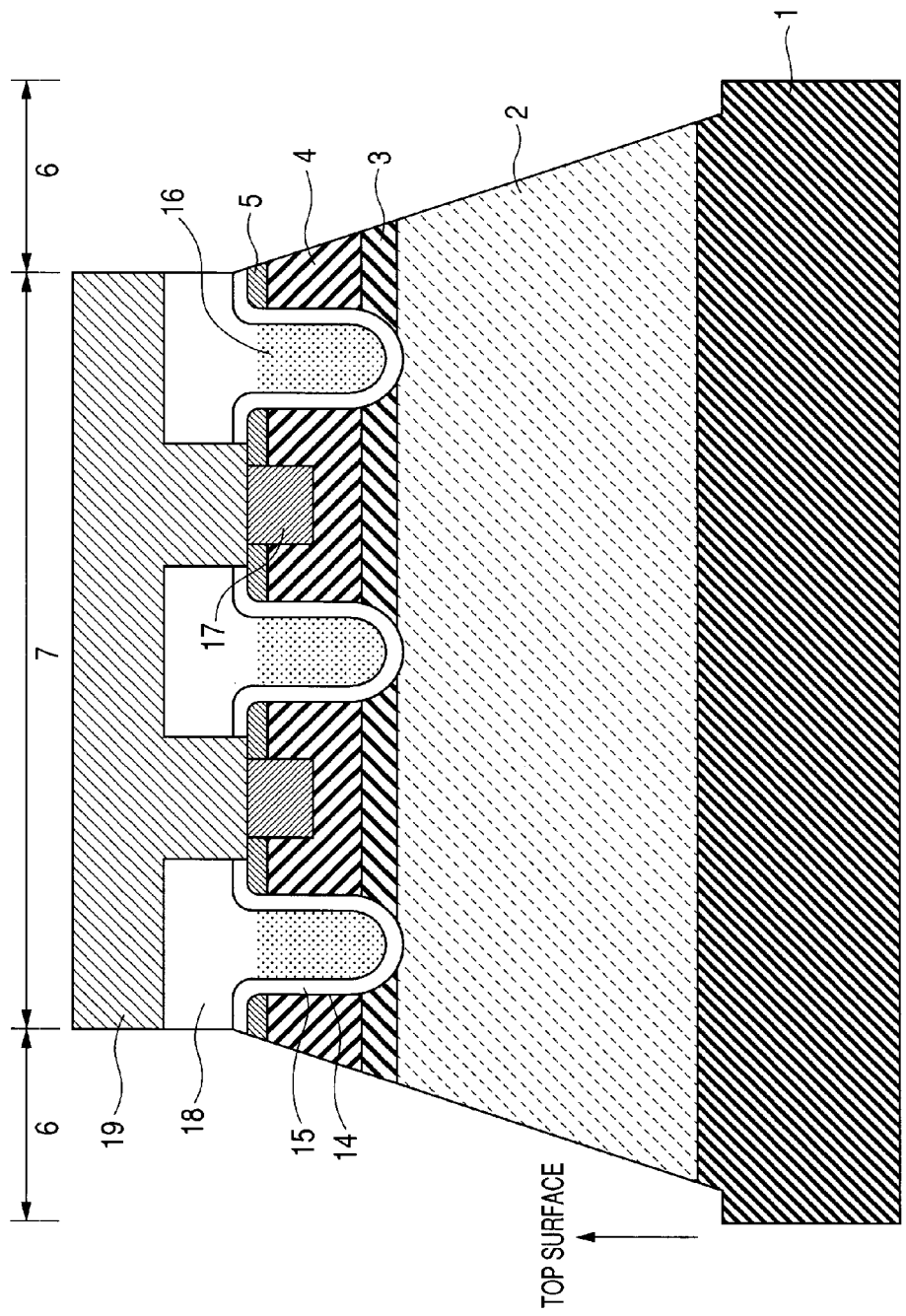
FIG. 1 is a schematic cross-sectional view showing a principal part of a first embodiment of a vertical trench MOSFET according to the present invention in the course of being manufactured.
Figure 2:
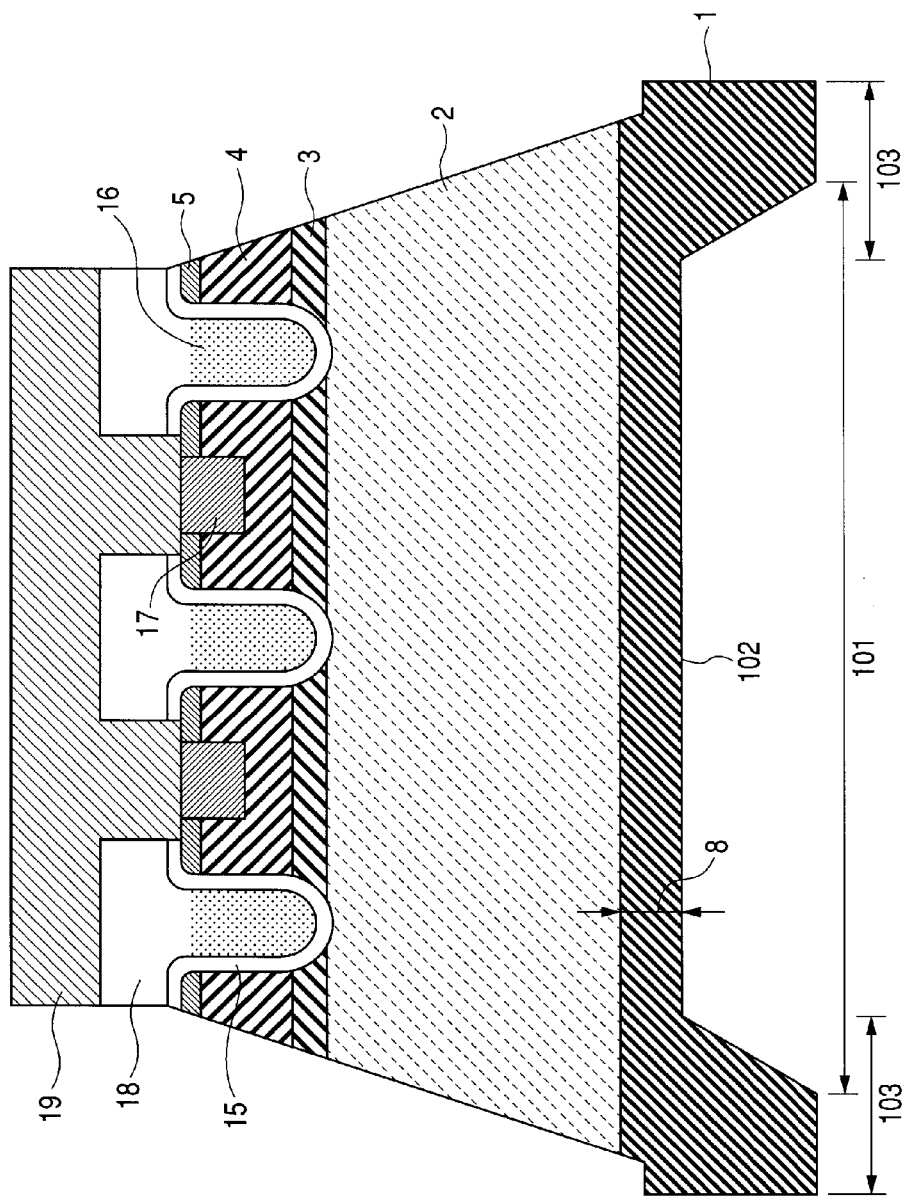
FIG. 2 is a schematic cross-sectional view showing the principal part of the vertical trench MOSFET of FIG. 1 after forming a recess on the bottom surface side of a substrate.
Figure 3:
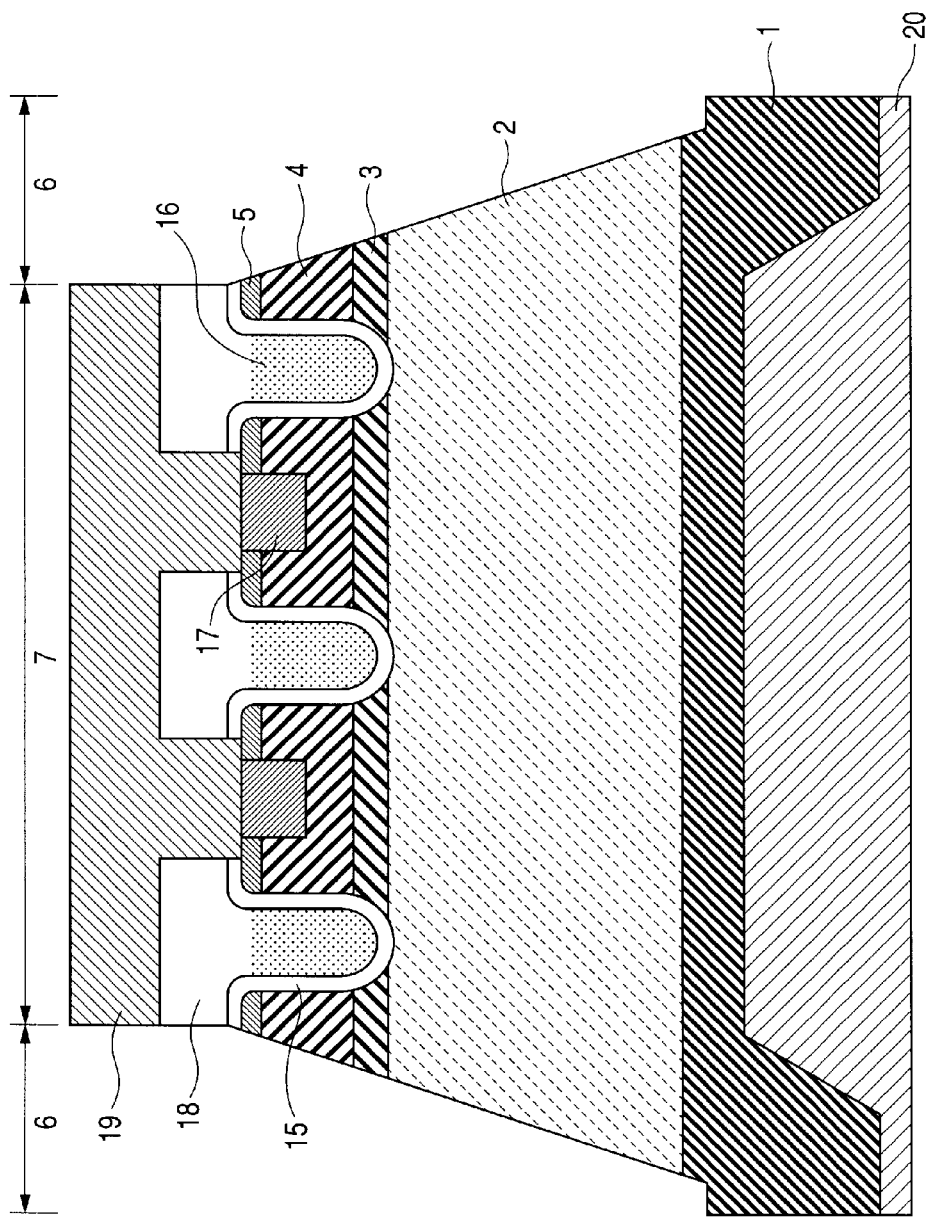
FIG. 3 is a schematic cross-sectional view showing the principal part of the vertical trench MOSFET of FIG. 2 with a drain electrode formed on the bottom surface of the recessed substrate.

FIGS. 1-3 are schematic cross-sectional views showing the manufacturing process steps of a first embodiment of a vertical trench MOSFET that uses a silicon carbide substrate. The use of a single crystal substrate of silicon carbide allows the semiconductor layer to be an epitaxially grown layer of silicon carbide or a hetero-epitaxially grown layer of gallium nitride. A single crystal of silicon carbide has various kinds of polytype. For a power semiconductor device, 4H—SiC or 6H—SiC can be used. The semiconductor layer includes any one of a semiconductor layer formed on a semiconductor substrate by epitaxial growth and formed by part of a semiconductor substrate.

In the first embodiment, a semiconductor device is obtained by epitaxially growing a semiconductor layer of silicon carbide on a semiconductor substrate of silicon carbide. FIGS. 1-3 show cross-sectional views of a vertical trench MOSFET in the order of the manufacturing steps. In the following, explanations will be made in the order according to the manufacturing steps.

FIG. 1 is a schematic cross-sectional view showing the principal part of the vertical trench MOSFET in the course of being manufactured by a conventional process. The structure of the MOSFET is of a conventional trench gate type. In the following explanations, the "top surface" of a semiconductor substrate is referred to as a surface on the upper side toward shown by an arrow and the "bottom surface" is referred to as a surface on the lower side. The bottom surface side corresponds to the other principal surface side of a semiconductor substrate on which side a recess is formed.

In an active region 7 where effective current flows, only three stripe trenches are illustrated as MOS structures. FIG. 1 is merely a schematic view. In an actual device, several hundreds to several thousands of stripes can be arranged on each chip with several tens micrometers pitches.

A wafer of a single crystal of silicon carbide having a thickness of 500 μm, a principal surface in the (11$\overline{2}$0) plane, and resistance of 0.01 Ωcm is used. The wafer becomes an n$^+$-type semiconductor substrate 1. In the wafer, the polytype is 4H and the impurity concentration is approximately $1\times10^{19}$ cm$^{-3}$. On the top surface (first principal surface side) of the substrate 1, a semiconductor layer of silicon carbide with an impurity concentration of $1\times10^{16}$ cm$^{-3}$ and a thickness of 10 μm is formed by an epitaxial growth. The semiconductor layer becomes an n$^-$-type semiconductor layer 2 (a drift layer). Next, by an epitaxial growth, a silicon carbide layer to be an n-type buffer region 3 with an impurity concentration of $1\times10^{17}$ cm$^{-3}$ and a thickness of 0.4 μm, a silicon carbide layer to be a p$^-$ well region 4 with an impurity concentration of $2\times10^{17}$ cm$^{-3}$ and a thickness of 1.0 μcm, and a silicon carbide layer to be an n$^+$-type source region 5 with an impurity concentration of $1\times10^{18}$ cm$^{-3}$ and a thickness of 0.5 μcm are formed in this order. The semiconductor, with each of the layers formed this way, is subjected to pyrogenic oxidation at 1100° C. for an hour to form a protection oxide film (not shown) with a thickness of the order of 50 nm on the surface of the substrate.

Subsequently, on the surface of the protection oxide film, an aluminum film (not shown) is deposited by sputtering so that the thickness thereof becomes 0.5 μm. The deposited aluminum film is then subjected to patterning in a photoprocess. Thus, an aluminum mask is formed. By using the mask, ICP (Inductive Coupled Plasma) etching is carried out with the use of SF$_6$ gas and O$_2$ gas to form trenches 14. Thereafter, the aluminum mask and the protection oxide film are removed.

Thereafter, on the inner wall of each of the trenches 14, a gate insulator film is formed. Since the sidewall of each of the trenches 14 is of silicon carbide, the method of forming the gate insulator film 15 can be selected from methods such as a thermal oxidation method, a method of forming an oxide film from a thin film of amorphous silicon or polysilicon, and a method of forming a gate insulator film such as an HTO (High Temperature Oxide) film, a silicon nitride film, or a ferroelectric film.

Thereafter, in the process steps of forming doped polysilicon electrodes 16, p+ regions 17, an interlayer insulator film 18, a source electrode 19, and a drain electrode 20 shown in FIG. 3, the same process steps as those in a well-known process of manufacturing a trench MOSFET can be employed.

The silicon carbide layers 3 to 5 formed by the foregoing epitaxial growth can be instead formed by ion implantation and activation annealing rather than by the epitaxial growth. After the semiconductor layer 2 and each of the silicon carbide layers 3 to 5 are formed on the top surface side of the semiconductor substrate 1, around the active region 7 of each semiconductor device, a breakdown voltage blocking structure region 6 is formed. From the top surface side of the substrate, trenches are formed by dicing each with a depth reaching the substrate 1. Inside of each of the trenches is filled with a CVD oxide film for protecting the surface of a mesa groove. After this, the top surface side of the substrate is protected by a material such as polyimide, resist, or a protection film as necessary.

Next, with reference to FIG. 2, an explanation will be made about a method of forming a recess 101 on the bottom surface side, i.e., on the other (second) principal surface side of the semiconductor substrate. The recess 101 is formed by engraving, i.e., removing, a section of the bottom surface of the substrate 1, which section is opposite to the MOS structure in the central section on the top surface side and is included in the active region 7 so that the thickness of a left thin section 8 of the substrate 1 becomes on the order of 1 to 50 μm. In a section opposite to the breakdown voltage blocking structure region 6 and surrounding a bottom 102 of the recess 101, the wafer is left with the original thickness to be provided as a supporting section 103. Of the recess 101, a section extending from the thin section 8 to the thick supporting section 103, that is a section surrounding the bottom 102 of the recess 101 to become the side face of the recess 101, has ordinarily some inclination, which depends on the method of forming the recess 101.

In this step, on the bottom surface of the substrate 1, the surface of the wafer is left on the outer-frame-like supporting section 103 in a section corresponding to the breakdown voltage blocking structure region 6. In the region inside the supporting section 103, the bottom 102 of the recess 101 as the surface of the thin section 8 is seen. As shown in FIG. 2, the substrate 1 has a generally inverse U-shaped cross section with the thin section 8 formed between the supporting sections 103. For convenience, such a shape is hereinafter referred to as a "membrane structure". When the entire wafer is viewed from the bottom surface in this step, formation of a lattice pattern is observed.

With the membrane structure, even though a wafer has the thin section 8 with a thickness of the order of 1 to 50 μm, the wafer is reinforced by the thick supporting section 103 having a thickness of 500 μm. This reduces the rate of the wafer cracking during the manufacturing process.

It is difficult to form the bottom surface of the wafer from the state shown in FIG. 1 to the state shown in FIG. 2 with the variation in thickness in the thin section 8 made on the order of 1 μm in the wafer plane with the current technology. For the thickness of the thin section 8 becoming less than 1 μm, the film thickness control is difficult. Further, the thickness less than 0.1 μm presents a danger of causing inferior breakdown voltage blocking in a punch-through mode. Therefore, the lower limit of the thickness is desirably taken as 1 μm.

An explanation will be made about the upper limit of the thickness of the thin section 8. The limit is determined with the electrical property of a semiconductor device taken into consideration. If the $n^+$-type semiconductor substrate 1 with volume resistivity of 0.01 Ωcm is recessed to form the thin section 8 50 μcm thick. Then, the on-resistance of the substrate 1 becomes 0.05 mΩcm$^2$. This is equivalent to 0.5% to the typical on-resistance 10 mΩcm$^2$ of a current MOSFET. Thus, even though MOS channel mobility is doubly increased, the on-resistance of the substrate 1 occupies only 1% to the typical on-resistance. Therefore, even though the thin section 8 of the $n^+$-type semiconductor substrate 1 has a thickness of 50 μm, this has no large effect on the electrical properties of the device. The thickness is in a sufficiently controllable range in the process technology. In the future, it is expected that the on-resistance reduction due to an improvement in MOS channel mobility and a scale-down in a MOS structure will compete in the same level with the on-resistance reduction brought into realization owing to thinning of the thin section 8 due to an improvement in processing accuracy.

The breakdown voltage blocking structure region 6 on the top surface side and the recess 101 on the bottom surface side, both shown in FIG. 2, can be formed by any one of the three kinds of methods explained below.

A first method is the method of using a dry etcher such as an RIE (Reactive Ion Etcher) and a plasma etcher. The method is, like that of forming trenches, a method of carrying out etching with an etching mask formed on a section where no etching is given. In recent years, the processing accuracy of a dry etcher has been improved to be equal to or less than ±5% in-plane variation. However, when recessing a substrate with a thickness of the order of 500 μm to a thickness of 1 to 50 μm, large amounts of by-products are produced together with an increased etching time. The increased etching time makes it necessary to take into consideration the possibility of causing degradation of a mask that initiates etching at the supporting section.

A second method is a sandblast method in which grinding is carried out by mechanically projecting particles. In comparison with a dry etch method, in the sand blast method, a load applied to a processing system is smaller with a required processing time being shorter. However, the controllability in the processing in the depth direction makes it difficult to process the substrate to be thin with a thickness down to on the order of 1 μm. Therefore, the sandblast method is suitable for fabrication the thin section 8 on the order of 20 to 50 μm thick. In the method, a variation in thickness sometimes becomes large. Thus, the range of the variation must be taken into consideration.

A third method is a method of using an FIB (Focused Ion Beam). Like in the sandblast method above, this method is similar to removing a target by mechanically projecting particles. Higher accuracy can be obtained with an ion beam than the sandblast method. However, like the dry etch method, an ion beam takes a longer processing time. The increased processing time sometimes results in ion source depletion. Thus, measures must be taken with such depletion taken into consideration.

The methods of forming the recess are not limited to the above-explained three methods. Moreover, a plurality of the methods can be combined. For example, after carrying out rough removal by sandblast, fine removal can be carried out by the use of an ion beam or a dry etcher. Since silicon carbide is chemically stable, no practical solution for chemically removing silicon carbide is found at present. The discovery of such a solution will allow formation of a recess by wet chemical etching.

FIG. 3 is a schematic cross-sectional view showing the principal part of the vertical trench MOSFET in the final state. After forming the membrane structure shown in FIG. 2, a metal, which forms a drain electrode 20, is deposited on the bottom surface by sputtering or evaporation, by which a cross-sectional shape as shown in FIG. 3 is obtained. Thereafter, at the center of the CVD oxide layer forming the breakdown voltage blocking structure region 6 on the top surface side of the substrate, dicing is carried out to cut out from the wafer each of chips of the semiconductor devices. At this time, the blade of a dicer carries out cutting of the wafer at a 500 μm thick section thereof. This allows the wafer to maintain sufficient mechanical strength to prevent cracking and chipping of the wafer together, without any problem associated therewith.

In the vertical trench gate MOSFET of the first embodiment, it is desirable to take the principal surface of the wafer as the (11 $\bar{2}$ 0) plane as was described above or a plane equivalent to this (a plane) with the sidewall face of the trench gate further taken as the (03 $\bar{3}$ 8) plane. By taking the sidewall face as the plane, channel mobility can be enhanced.

By the above process, a MOSFET can be obtained in which the n-type semiconductor substrate is provided with, in the active region as the central section on the one principal surface (the first or top surface) side thereof, an n-type semiconductor layer of silicon carbide having a thickness of 10 μm necessary for breakdown voltage blocking and formed by epitaxial growth. Moreover, the semiconductor substrate has on the other principal surface (the second or bottom surface) side thereof the recess at the position facing the central section and the supporting section that surrounds the bottom of the recess and provides the side faces of the recess. In the MOSFET, the semiconductor substrate and the semiconductor layer have the same conductivity type, and the bottom of the recess is included in a region in the semiconductor substrate with the impurity concentration thereof is higher than those of the semiconductor layer.

In the first embodiment, the explanations were made with an n-channel type MOSFET taken as an example. The MOSFET, however, can be provided with the p-type. Moreover, the semiconductor device can be any of devices such as an IGBT, a GTO thyristor, a p-n diode, and a Schottky diode rather than a MOSFET. For example, a trench gate IGBT can be fabricated by forming a $p^+$-region by ion implantation into the bottom of the recess, or by substituting the $n^+$-type substrate 1 with a $p^+$-type substrate. The IGBT can be provided with a structure in which an $n^+$-type silicon carbide layer is provided between the $p^+$-type substrate and $n^-$-type semiconductor layers.

Moreover, in the first embodiment, although a trench gate MOSFET was taken as an example, the above-explained processing carried out on the bottom surface side of the semiconductor substrate can be applied also to a planar gate MOSFET. Although a mesa structure was employed in the breakdown voltage blocking structure region 6, another breakdown voltage blocking structure such as a guard ring or a STI (shallow trench isolation) can be formed.

In the first embodiment, the $n^+$-type substrate 1 with low resistance is provided as an $n^+$-type drain region on the bottom surface of the device. However, an $n^-$-type wafer with high resistance can be used with an $n^+$-type drain region with low resistance formed on the bottom surface thereafter.

The semiconductor has the following advantages. First, the drain region is formed after the recess is formed on the bottom surface of the substrate. Thus, there is no difficulty in controlling the thickness of the thin section by the processing method of the first embodiment. Second, an $n^+$-type drain region having resistance lower than that of a commercially available $n^+$-type substrate and high impurity concentration controllability can be formed.

FIGS. 4-7 are schematic cross-sectional views showing the manufacturing steps of a second embodiment of a vertical trench MOSFET that also uses silicon carbide as the chief material thereof. In the second embodiment, explanations will be made about a semiconductor device obtained by making part of the semiconductor of silicon carbide provided as a semiconductor layer, as well as forming a drain region by ion implantation.

Figure 4:
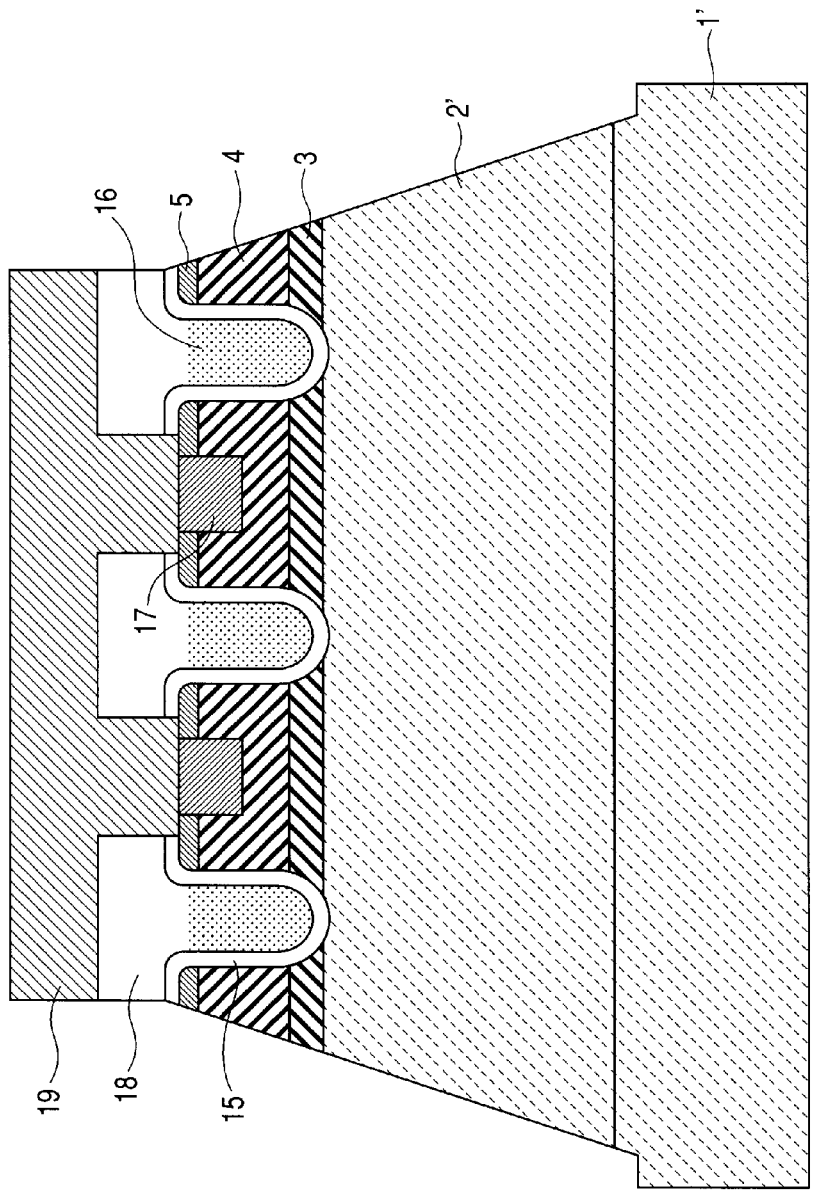
FIG. 4 is a schematic cross-sectional view showing a principal part of a second embodiment of a vertical trench MOSFET according to the present invention in the course of being manufactured.

FIG. 4 is a schematic cross-sectional view showing a principal part of a semiconductor device in the course of being manufactured in which the $n^+$-type semiconductor substrate 1 and the $n^-$-type semiconductor layer 2 of the vertical trench MOSFET of the first embodiment is substituted with an $n^-$-type semiconductor substrate 1' of silicon carbide with high resistance. A wafer with an impurity concentration of $1 \times 10^{16}$ cm$^{-3}$ or more that becomes the substrate 1' is provided. Except for this, the MOS structure and the breakdown voltage blocking structure are formed in the same way as the first embodiment.

Figure 5:
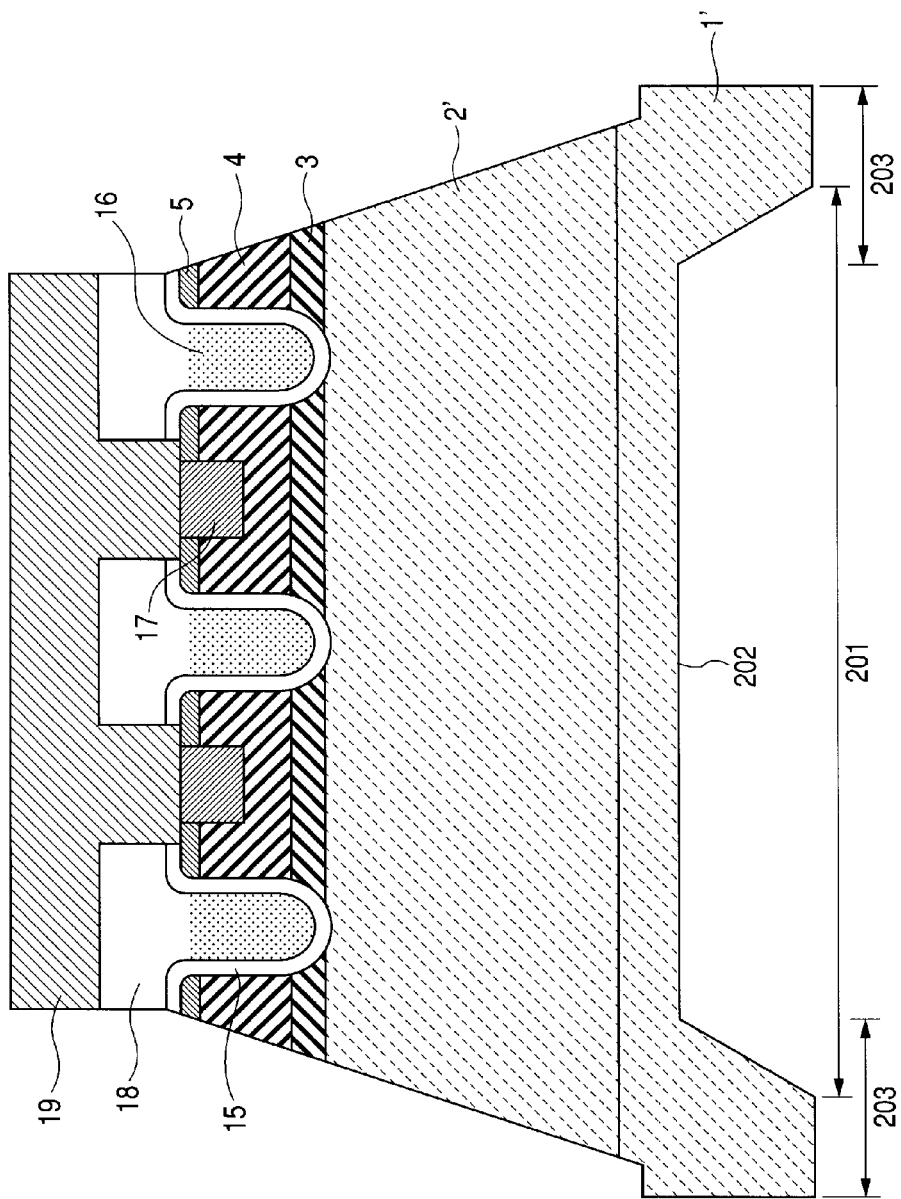
FIG. 5 is a schematic cross-sectional view showing the principal part of the vertical trench MOSFET of FIG. 4 after forming a recess on the bottom surface side of the substrate.

FIG. 5 is a schematic cross-sectional view showing a state after the recess is formed on the bottom surface of the substrate 1'. A membrane structure including a recess 201 and a supporting section 203 can be formed by the same method as that in the first embodiment. The upper part of the substrate 1' becomes a semiconductor layer 2'. The depth of the recess 201 and the thickness of the semiconductor layer 2' are determined by the design breakdown voltage of the MOSFET.

Figure 6:
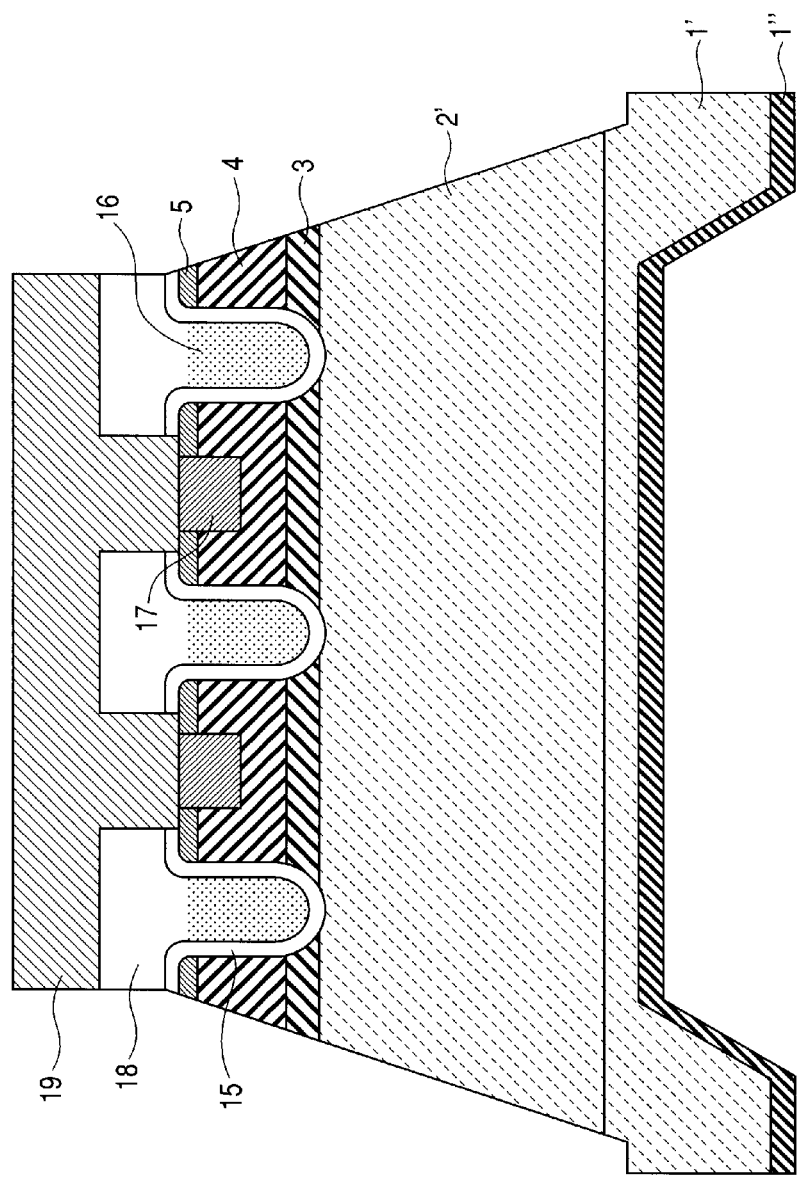
FIG. 6 is a schematic cross-sectional view showing the principal part of the vertical trench MOSFET of FIG. 5 with a drain region formed on the bottom surface of the recessed substrate.

Next, as shown in FIG. 6, an $n^+$-type drain region 1" is formed. Into the bottom surface of the wafer including a bottom 202 of the recess 201, nitrogen (N) ions are implanted. For activating the implanted ions, to make the conductivity type of the bottom surface of the wafer an $n^+$-type, activation annealing is carried out by, for example, laser irradiation. When carrying out activation with a temperature being elevated, silicon carbide necessitates a high temperature of 1500° C. or more. Annealing carried out at such a high temperature can destroy a MOS structure formed on the top surface. The laser irradiation, however, can elevate a temperature of only the $n^+$-type drain region 1" on the bottom surface for activation, without exposing the top surface to a high temperature. Thus, annealing by the laser irradiation is preferable.

Figure 7:
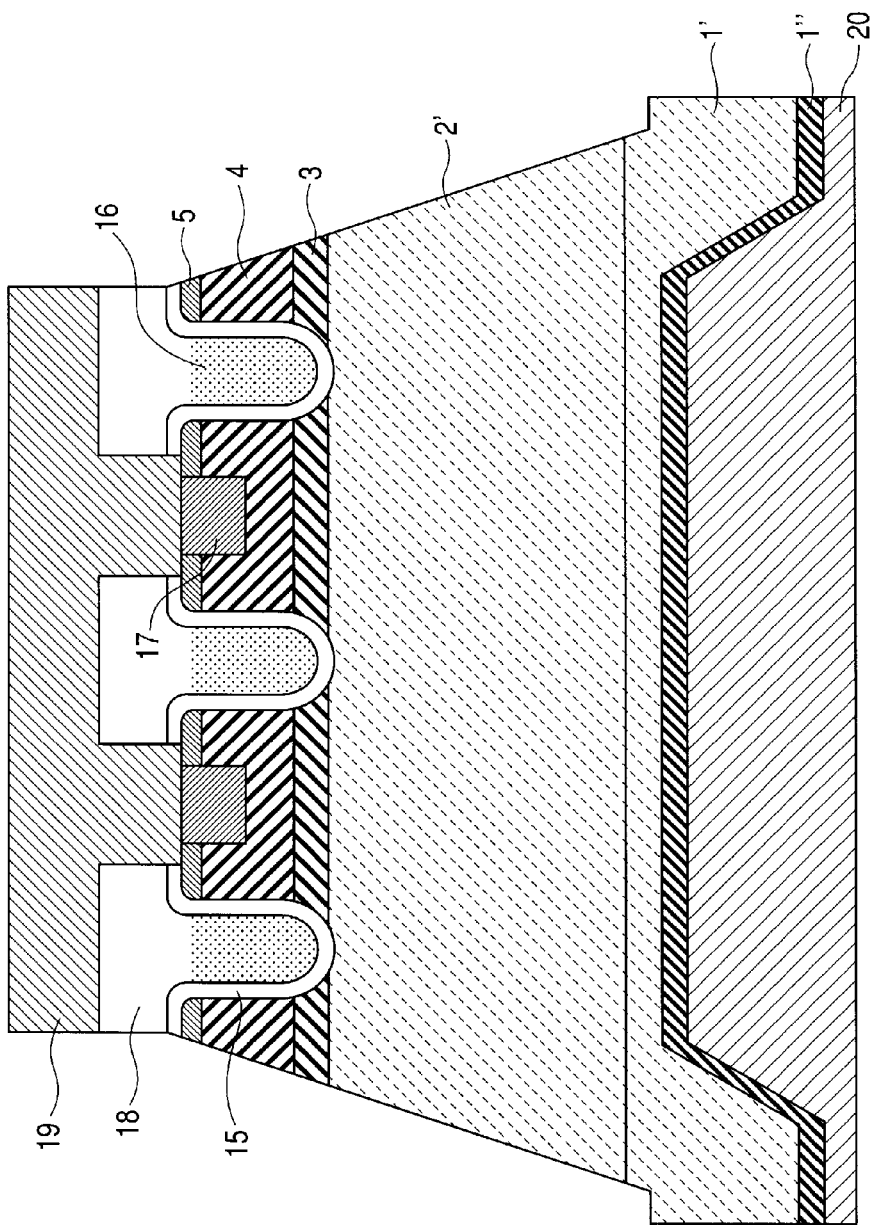
FIG. 7 is a schematic cross-sectional view showing the principal part of the vertical trench MOSFET of FIG. 6 with a drain electrode formed on the surface of the drain region.

Subsequently, as shown in FIG. 7, on the surface of the drain region 1", a metal, which becomes a drain electrode 20, is formed by sputtering or evaporation, by which a MOSFET structure is obtained. Selection of the direction of crystal plane of the wafer and a dicing method for cutting and separating the wafer into chips are the same as those in the first embodiment.

By the above processing, a MOSFET in which the semiconductor substrate and the semiconductor layer are of the same conductivity type and which has at the bottom of the recess a region with an impurity concentration higher than that in the semiconductor layer can be obtained.

The semiconductor device can be provided as a device such as an IGBT rather than a MOSFET. For example, substitution of the $n^+$-type drain region by a $p^+$-type allows the device to be fabricated as a trench gate IGBT. The IGBT may be presented to have a structure in which an $n^+$-type silicon carbide layer is provided between the $p^+$-type drain region and the $n^-$-type semiconductor substrate.

In each of the devices in the first and second embodiments, the MOS structure on the top surface was first formed before processing the bottom surface of the substrate. Also in manufacturing a power semiconductor device with silicon used as a principal material, when the entire surface of the wafer is ground, the processing is carried out in the same order. The main reason is that the wafer ground thin to a thickness of 70 to 100 μm is liable to crack and chip, making its handling so difficult as to make the grinding process desired to be carried out in the latest possible stage.

On the other hand, in the membrane structure explained in each of the first and second embodiments, only the section to be recessed in the wafer is removed with the supporting section left remaining intact. The thick supporting section plays a role of reinforcement to provide the wafer with such mechanical strength necessary to withstand during the processing.

Therefore, in each of the first and second embodiments, the processing can be also carried out in the order in which, after the wafer is prepared, the membrane structure with the recess and the supporting section is first formed on the bottom surface and the active region structure subsequently formed on the top surface.

In the first and second embodiments, it is important when forming the recess on the bottom surface of the substrate to carry out monitoring of the thickness of the thin section. For a method of monitoring the thickness of the thin section, the following method can be employed:

(1) Materials such as silicon carbide and gallium nitride are transparent to light beams with almost all of wavelengths in the visible range except light in the range from blue to ultraviolet with short wavelengths. Therefore, when rececessing the bottom surface, the thickness of the thin section can be monitored by projecting light in the visible to infrared range and observing interference with the reflected light wave. The method is widely adopted in CMP (Chemical Mechanical Polishing). When this technique is applied to the monitoring of the thickness of a thin wafer, it enables accurate film thickness control.

(2) In the case of using gallium nitride, when carrying out film deposition by epitaxial growth, an ELOG (Epitaxial Lateral Over Growth) technology using a mask is widely used. The technology is expected to be also applied to the epitaxial growth of silicon carbide in future. In general, the ELOG is carried out so as to leave a mask material to be buried in a bulk. Therefore, when processing the bottom surface of the substrate, the mask material can be used as a marker. Namely, in recessing the bottom surface, it is necessary only to stop the processing when the mask material is exposed. This can enhance the controllability of the thickness of the thin section.

By forming a recess in the semiconductor substrate facing the active region of the semiconductor device, and having large in a proportion occupying in on-resistance, the distance between the semiconductor layer and the bottom surface of the recess is decreased to lower the on-resistance of the device. Furthermore, by providing the supporting section, occurrence of defects such as cracking of the substrate in a semiconductor process can be inhibited. The present method is effective in forming around the recess a region with a high impurity concentration such as a drain region when a semiconductor substrate with a low impurity concentration is used.

While the present invention has been particularly shown and described with reference to preferred embodiment thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2006-066876 filed on 13 Mar. 2006. The disclosure of the priority application, in its entirety, including the drawings, claims, and the specification thereof, is incorporated herein by reference.

What is claimed is:

1. A semiconductor device comprising:
a semiconductor substrate composed of silicon carbide having a first principal surface side and a second principal surface side opposite the first principal surface side;
a semiconductor layer composed of one of silicon carbide or gallium nitride having a first predetermined thickness;
an active region on the semiconductor layer,
wherein the semiconductor layer is on the first principal surface side of the substrate at a central section of the first principal surface side,
wherein the semiconductor layer has side walls each with a mesa groove that forms a planar breakdown voltage blocking structure having a mesa profile, with the semiconductor layer being wider at the first principal surface side of the semiconductor substrate than at a side of the active region,
wherein in the second principal surface side of the substrate, the substrate has a recess aligned with the active region at a position facing the central section, and the substrate has a supporting section that surrounds a bottom of the recess and defines side faces of the recess,
wherein the recess partly extends into the semiconductor substrate without extending through the semiconductor substrate so that a second predetermined thickness exists between the bottom of the recess and the first principal surface side,
wherein the bottom of the recess is closest to the first principal surface side and is recessed from and farthest from an opening of the recess at the second principal surface side in a direction perpendicular to the second principal surface side, and
wherein the side faces each have a mesa profile, with the opening of the recess at the second principal surface side being wider than at the bottom of the recess.

2. The semiconductor device as claimed in claim 1, wherein the semiconductor substrate and the semiconductor layer each are of a first conductivity type, and in the bottom of the recess, a region of one of the first or second conductivity type with an impurity concentration higher than an impurity concentration in the semiconductor layer is provided.

3. The semiconductor device as claimed in claim 2, wherein in the bottom of the recess, between the semiconductor layer and the region of the second conductivity type, another region of the first conductivity type with an impurity concentration higher than the impurity concentration in the semiconductor layer is provided.

4. The semiconductor device as claimed in claim 1, wherein the semiconductor substrate is of a second conductivity type, the semiconductor layer is of a first conductivity type, and in the bottom of the recess, a region of the second conductivity type with an impurity concentration higher than an impurity concentration in the semiconductor layer is provided.

5. The semiconductor device as claimed in claim 4, wherein in the bottom of the recess, between the semiconductor layer and the region of the second conductivity type, another region of the first conductivity type with an impurity concentration higher than the impurity concentration in the semiconductor layer is provided.

6. The semiconductor device as claimed in claim 1, wherein the semiconductor layer is an epitaxial layer or a part of the substrate.

7. The semiconductor device as claimed in claim 1, wherein the second predetermined thickness is in a range of 1 to 50 µm.

8. The semiconductor device as claimed in claim 1, wherein the supporting section of the semiconductor substrate has a thickness in the range of 200 to 500 µm.

9. The semiconductor device as claimed in claim 1, wherein the mesa grooves each extend partly into the semiconductor substrate at the first principal surface side inwardly from a respective side wall of the semiconductor substrate and forms a ledge surface that is parallel with the second principal surface side.

10. A method of manufacturing a semiconductor device including the steps of:
providing a semiconductor substrate composed of silicon carbide having a first principal surface side and a second principal surface side opposite the first principal surface side;
forming on the first principal surface side of the semiconductor substrate, at a central section of the first principal surface side, a semiconductor layer of one of silicon carbide or gallium nitride having a first predetermined thickness;
forming an active region on the semiconductor layer;
forming in the second principal surface side of the substrate a recess aligned with the active region at a position facing the central section and a supporting section that surrounds a bottom of the recess and defines side faces of the recess, wherein the semiconductor layer has side walls each with a mesa groove forming a planar breakdown voltage blocking structure having a mesa profile, with the semiconductor layer being wider at the first principal surface side of the semiconductor substrate than at a side of the active region, wherein the recess partly extends into the semiconductor substrate without extending through the semiconductor substrate so that a second predetermined thickness exists between the bottom of the recess and the first principal surface side, wherein the bottom of the recess is closest to the first principal surface side and is recessed from and farthest from an opening of the recess at the second principal surface side in a direction perpendicular to the second principal surface side, and wherein the side faces each have a mesa profile, with the opening of the recess at the second principal surface side being wider than at the bottom of the recess.

11. The method of manufacturing a semiconductor device as claimed in claim 10, wherein the semiconductor layer is formed by an epitaxial growth or is a part of the substrate.

12. The method of manufacturing a semiconductor device as claimed in claim 11, wherein the semiconductor layer is formed by an epitaxial lateral over growth using a mask and the mask used in the epitaxial lateral over growth is used as a marker for stopping removal of the substrate when forming the recess.

13. The method of manufacturing a semiconductor device as claimed in claim 11, wherein the recess is formed after forming the semiconductor layer.

14. The method of manufacturing a semiconductor device as claimed in claim 11, wherein the recess is formed before forming the semiconductor layer.

15. The method of manufacturing a semiconductor device as claimed in claim 10, wherein the recess is formed by at least one of dry etching or particle blasting.

16. The method of manufacturing a semiconductor device as claimed in claim 10, further including the step of, after forming the recess, implanting ion and activating annealing the implanted ions onto the second principal surface side of the semiconductor substrate.

17. The method of manufacturing a semiconductor device as claimed in claim 16, wherein the activating annealing is carried out by laser annealing.

18. The method of manufacturing a semiconductor device as claimed in claim 10, wherein the recess is formed while optically measuring a thickness of the bottom of the recess by projecting light, having a wavelength range allowing the light to transmit the semiconductor substrate, from the first principal surface side of the semiconductor substrate.

* * * * *